(12) United States Patent
Esnault et al.

(10) Patent No.: US 11,828,816 B2
(45) Date of Patent: Nov. 28, 2023

(54) DETECTION OF CABLE OF A NETWORK OF CABLES BY A TELECOMMUNICATION EQUIPMENT ITEM

(71) Applicant: Orange, Issy-les-Moulineaux (FR)

(72) Inventors: Régis Esnault, Chatillon (FR); Pascal Pagani, Chatillon (FR)

(73) Assignee: Orange, Issy-les-Moulineaux (FR)

( * ) Notice: Subject to any disclaimer, the term of this patent is extended or adjusted under 35 U.S.C. 154(b) by 0 days.

(21) Appl. No.: 16/436,212

(22) Filed: Jun. 10, 2019

(65) Prior Publication Data

US 2019/0377019 A1 Dec. 12, 2019

(30) Foreign Application Priority Data

Jun. 11, 2018 (FR) ...................................... 1855059

(51) Int. Cl.
*G01R 31/60* (2020.01)
*H01Q 13/20* (2006.01)
(Continued)

(52) U.S. Cl.
CPC ........... *G01R 31/60* (2020.01); *H01Q 13/203* (2013.01); *H04B 3/46* (2013.01); *H04L 43/50* (2013.01)

(58) Field of Classification Search
CPC ........ G01R 31/60; H01Q 13/203; H04B 3/46; H04L 43/50
(Continued)

(56) References Cited

U.S. PATENT DOCUMENTS 3,831,086 A * 8/1974 Pesto ..................... G01R 31/60
324/67
3,882,287 A * 5/1975 Simmonds ............. G01R 31/60
379/22.03
(Continued)

FOREIGN PATENT DOCUMENTS

DE 102010041936 A1 4/2012
EP 2625550 A2 * 8/2013 ........... G01R 29/085
(Continued)

OTHER PUBLICATIONS

PatchApp&Go Continuity Tester and Cable Tracer. About Us Page. www.patchappgo.com/about—No wayback date. 2021 (Year: 2021).*
(Continued)

*Primary Examiner* — Jermele M Hollington
*Assistant Examiner* — Sean Curtis
(74) *Attorney, Agent, or Firm* — David D. Brush; Westman, Champlin & Koehler, P.A.

(57) ABSTRACT

A method and telecommunication equipment item for detecting a cable of a network of cables, in particular of a network of electrical cables, especially ones which are not detectable to the naked eye. For example, a network of electrical cables may be embedded inside the partitions of a building. The telecommunication equipment item has a receiver and a detector of a predefined electrical signal injected into a network of cables as a function of electromagnetic signals received by the receiver. Thus, the receiver is not required to be a specific equipment item dedicated solely to this use but may be implemented in a telecommunication equipment item with which users are widely equipped such as a smartphone, a tablet, etc.

22 Claims, 5 Drawing Sheets

(51) Int. Cl.
*H04B 3/46* (2015.01)
*H04L 43/50* (2022.01)

(58) Field of Classification Search
USPC .................. 324/66, 528, 207.11, 207.15
See application file for complete search history.

(56) References Cited

U.S. PATENT DOCUMENTS

| | | | | |
|---|---|---|---|---|
| 5,534,869 | A * | 7/1996 | Harman | G08B 13/2497 |
| | | | | 340/850 |
| 5,995,588 | A * | 11/1999 | Crick | G01R 31/08 |
| | | | | 379/22 |
| 7,253,636 | B2 * | 8/2007 | Shambaugh, Jr. | G01R 27/04 |
| | | | | 324/529 |
| 8,076,923 | B2 * | 12/2011 | Suozzo | G01R 31/58 |
| | | | | 324/66 |
| 8,791,701 | B2 * | 7/2014 | Branson | G01V 3/15 |
| | | | | 324/67 |
| 8,811,278 | B2 * | 8/2014 | Takei | G01S 13/767 |
| | | | | 370/328 |
| 9,150,195 | B2 * | 10/2015 | Suzuki | B60R 25/245 |
| 9,306,622 | B2 * | 4/2016 | Kumar Kn | H04L 27/0002 |
| 9,354,033 | B2 * | 5/2016 | Hyacinthe | G01R 33/0094 |
| 9,379,829 | B2 * | 6/2016 | Ruth | H04B 17/354 |
| 9,400,301 | B2 * | 7/2016 | Kanne | G01R 31/58 |
| 9,602,299 | B1 * | 3/2017 | Misener | H04B 17/18 |
| 9,660,742 | B2 * | 5/2017 | Ruth | H04L 27/34 |
| 10,003,364 | B1 * | 6/2018 | Willis, III | H04B 1/0475 |
| 10,148,371 | B2 * | 12/2018 | Ruth | H04L 27/34 |
| 10,284,632 | B2 * | 5/2019 | Kanne | G01R 1/025 |
| 10,312,952 | B2 * | 6/2019 | Willis, III | H04B 3/32 |
| 10,338,317 | B2 * | 7/2019 | Bauco | G02B 6/0006 |
| 10,355,745 | B2 * | 7/2019 | Henry | H04B 3/04 |
| 10,416,332 | B2 * | 9/2019 | Lin | G01V 3/165 |
| 10,534,135 | B2 * | 1/2020 | Bauco | G02B 6/4482 |
| 10,707,916 | B2 * | 7/2020 | Fertner | G01R 27/28 |
| 10,727,583 | B2 * | 7/2020 | Henry | H04W 16/28 |
| 10,739,472 | B2 * | 8/2020 | Gernot | G01S 19/11 |
| 10,764,762 | B2 * | 9/2020 | Barzegar | H01P 5/087 |
| 2011/0109437 | A1 | 5/2011 | Olsson | |
| 2013/0127448 | A1 * | 5/2013 | Hyacinthe | G01V 3/10 |
| | | | | 324/207.11 |
| 2014/0292348 | A1 * | 10/2014 | Kanne | G01R 31/58 |
| | | | | 324/537 |
| 2015/0042307 | A1 * | 2/2015 | Cholayil | G01R 29/085 |
| | | | | 324/66 |
| 2016/0381123 | A1 * | 12/2016 | Kanne | H04L 67/10 |
| | | | | 709/224 |
| 2017/0078619 | A1 * | 3/2017 | Chang | H04L 41/0853 |
| 2018/0106923 | A1 * | 4/2018 | Lin | G08B 21/18 |
| 2018/0136398 | A1 * | 5/2018 | Bauco | G02B 6/001 |
| 2018/0136399 | A1 * | 5/2018 | Bauco | G02B 6/0068 |
| 2018/0227014 | A1 * | 8/2018 | Fertner | H04B 3/46 |
| 2019/0013577 | A1 * | 1/2019 | Henry | H01Q 9/30 |
| 2019/0041447 | A1 * | 2/2019 | Wang | H01Q 7/08 |
| 2019/0074917 | A1 * | 3/2019 | Ruth | H04L 27/34 |
| 2019/0104419 | A1 * | 4/2019 | Barzegar | H01P 3/16 |
| 2019/0140675 | A1 * | 5/2019 | Willis, III | H04W 24/02 |
| 2019/0140694 | A1 * | 5/2019 | Henry | H01Q 13/02 |
| 2019/0179035 | A1 * | 6/2019 | Gernot | G01S 19/50 |
| 2019/0377019 | A1 * | 12/2019 | Esnault | H04L 43/50 |

FOREIGN PATENT DOCUMENTS

| | | | | |
|---|---|---|---|---|
| EP | 3581947 | A1 * | 12/2019 | ........... G01R 29/085 |
| FR | 2996401 | A1 * | 4/2014 | .............. H01Q 1/32 |
| FR | 3081638 | A1 * | 11/2019 | ........... G01R 29/085 |
| WO | WO-2012045516 | A2 * | 4/2012 | ........... G01R 29/085 |
| WO | WO-2014053758 | A1 * | 4/2014 | .............. H01Q 1/32 |
| WO | WO-2014053759 | A1 * | 4/2014 | .............. H01Q 1/32 |
| WO | WO-2017015084 | A1 * | 1/2017 | ............ G02B 6/0006 |
| WO | WO-2017015085 | A1 * | 1/2017 | ............ G02B 6/001 |
| WO | WO-2017030474 | A1 * | 2/2017 | ............ G01R 27/28 |
| WO | WO-2017176212 | A1 * | 10/2017 | ........... G01R 29/085 |
| WO | WO-2020000870 | A1 * | 1/2020 | ......... G01R 29/0871 |

OTHER PUBLICATIONS

Apple (iPhone) App Store Preview—Patch App & Go app details including copyright of 2017. (Year: 2017).*
ElectronicsForYou—How Do Mobile Phones Produce Electromagnetic Radiation? Mar. 20, 2018. https://www.electronicsforu.com/technology-trends/learn-electronics/mobile-phones-electromagnetic-radiation (Year: 2018).*
English Translation of WO 2014/053758 A1 (Year: 2014).*
English translation of the French Written Opinion for corresponding French Application No. 1855059, filed Jun. 11, 2018.
French Search Report and Written Opinion for corresponding French Application No. 1855059, filed Jun. 11, 2018.

* cited by examiner

DETECTION OF CABLE OF A NETWORK OF CABLES BY A TELECOMMUNICATION EQUIPMENT ITEM

FIELD OF THE DISCLOSURE

The invention relates to the detection of cable of a network of cables, in particular of a network of electrical cables, especially ones which are not detectable to the naked eye. It may entail, for example, a network of electrical cables embedded inside the partitions of a building or a flooring (indoor or outdoor).

BACKGROUND OF THE DISCLOSURE

When a user wishes to ascertain the layout of the electrical network (or communication network) of their residence, for example before drilling into a wall so as to avoid severing a cable, or in order to add a junction box or a new socket, he can verify which circuit breaker a given socket is hooked up to through a simple test by flicking the switch of each circuit breaker and then track the cable when it is visible.

However, when the electrical network is embedded inside the partitions, it is impossible to ascertain the layout of the cables by simple visual inspection. It is therefore not possible to have more information about the structure of the electrical network and in particular, to retrieve the order of the electrical sockets connected up in series on a branch of the network. Various specialized tools for detecting embedded cables have been devised to alleviate this problem, such as material detectors, and cable tracers.

Material detectors such as the Detect 150 (registered trademark) wall scanner detector from Bosch operates on the radar principle. The materials detection tool emits a signal, in particular in the form of an electromagnetic wave or of an acoustic wave such as ultrasounds. This wave is reflected by the materials present in the wall, and in particular by the cables. The reflected signal is captured by the materials detection tool which analyzes it: in particular which calculates the duration of propagation of the wave and/or measures the power of the received signal. Thus the materials detection tool provides location information in respect of the cables in particular in respect of distance on the basis of the calculation of duration of propagation and optionally additional information relating to the cables such as the types of cables, in particular of constituent materials (metals, plastics, etc.) of the cable on the basis of the power received.

Cable tracers offer detection of cables with more precise location than that provided by material detectors. They utilize the conducting nature of the cables to be detected by emitting a specific electrical signal on the cable such that the cable no longer behaves as a shielded conductor but radiates a part of the signal in electromagnetic wave form. Accordingly, cable tracers comprise two items of equipment operating together: a wired emitter and an electromagnetic receiver of fields. The emitter of the cable tracer is physically connected to an end of the cable to be detected. For example, the "Localisateur de Câble 2042" (registered trademark) cable tracer from Fluke comprises an emitter able to be connected to the cable with the aid of clips, whilst the emitter of the "Wire Tracer PCE-191 CB" (registered trademark) cable tracer from PCE Instruments comprises an electrical plug which facilitates its connection to the sockets of an electrical network of a building. The emitter of the cable tracer injects the characteristic electrical signal into the cable to be detected, in particular a signal whose frequency is sufficiently high for the signal to be radiated by the cable. The radiation occurs all along the cable and the radiated electromagnetic field level is all the higher near the cable. The receiver of the cable tracer measures the electromagnetic field level sensed and displays this level, for example in the form of a number or of a luminous indicator. By moving the cable tracer's receiver along a wall, the user can track the positions where the electromagnetic field produced by the radiation of the cable is highest and therefore determine the position of the cable inside the wall.

All these solutions: material detectors, cable tracers require complex and expensive electronic equipment items which are dedicated solely to this use. Consequently, they are reserved for professionals in the sector. This therefore involves high risks of incidents on the cable networks of a building since home DIY has become an activity much prized by a large number of people.

SUMMARY

One of the aims of an exemplary embodiment of the present invention is to remedy drawbacks of the prior art.

A subject of an exemplary embodiment of the invention is a telecommunication equipment item comprising a receiver of electromagnetic signals which is able to receive communication signals, characterized in that the telecommunication equipment item comprises a detector of a predefined electrical signal injected into a network of cables as a function of electromagnetic signals received by the receiver.

Thus, the receiver of the cable tracer is not a specific equipment item dedicated solely to this use but implemented in a telecommunication equipment item with which users are widely equipped such as a smartphone, a tablet, etc.

Advantageously, the telecommunication equipment item comprises:
a wired transmission interface able to be connected to a network of cables, and
a generator of the predefined electrical signal able to be injected into the network of cables by using the wired transmission interface.

Thus, the emitter of the cable tracer is not a specific equipment item dedicated solely to this use but implemented in a telecommunication equipment item with which users are widely equipped such as a smartphone, a tablet, etc.

Advantageously, the telecommunication equipment item comprises a controller of emission of predefined electrical signals which is able to trigger an emission via a wired transmission interface of a communicating object of the predefined electrical signal in a cable network to which the communicating object is connected by means of the wired transmission interface.

Thus, the management of the power supply in particular of the batteries of the telecommunication equipment item can be optimized since the latter is aware of the instant of emission of the predefined electrical signal serving for the cable location and little therefore activate or deactivate the electrical signal detector predefined accordingly.

Advantageously, the predefined electrical signal detector comprises a device for measuring the level of the received signal in a frequency band associated with the receiver.

Thus, cable location is carried out in a simple manner: that is to say not implementing complex calculations and consequently not overloading by the means of calculations of the telecommunication equipment item. The advantage is that the telecommunication equipment item having other functions, these other functions are not slowed down or frozen through the use of cable location.

Advantageously, the telecommunication equipment item comprises a generator of a location information item as a function of the predefined electrical signal detected by the detector, the location information item being able to be reproduced by a reproduction device.

Thus, the user accesses the location information item in a simplified manner.

Advantageously, the location information item is able to control an indicator of the reproduction device as a function of the electromagnetic field level of the predefined electrical signal detected by the detector.

Advantageously, the telecommunication equipment item comprises a camera able to capture a unitary image during the implementation of the detector of the predefined electrical signal, the unitary image being able to be provided to the location information item generator.

Thus, the location information item provided allows the user to mark the location more precisely, further reducing the risks of location errors.

Advantageously, the telecommunication equipment item comprises an extended-image generator for generating an extended image as a function of unitary images captured by the camera during the implementation of the detector of the predefined electrical signal, the extended image being able to represent a stitching of the unitary images and to be provided to the location information item generator.

Thus, the user has an overall view of the location of a cable on a section of wall or indeed an entire wall, or indeed several walls (in 2D or in 3D) instead of a point by point location allowing better management of the forthcoming works, see the planning process.

Advantageously, the extended-image generator uses data originating from at least one accelerometer of the telecommunication equipment item.

Thus, the extended image generation is facilitated.

Advantageously, the telecommunication equipment item comprises an image processing device able to superimpose on an image an information item as a function of the electromagnetic field level of the predefined electrical signal detected by the detector, the processed image being able to be provided to the reproduction device.

A subject of an exemplary embodiment of the invention is also a communicating object comprising a wired transmission interface able to be connected to a network of cables, characterized in that the communication object comprises a generator of the predefined electrical signal able to be injected into a network of cables by using the wired transmission interface.

Thus, the telecommunication equipment item in which the receiver of the cable tracer is implemented does not need to be connected by a very long cable to the cable to be detected with the risk of damage on the cable or of disconnection since it is the communicating object which is connected to this cable to be detected and in which the emitter of the cable tracer is implemented.

A subject of an exemplary embodiment of the invention is further a method of cable network location able to be implemented by a telecommunication equipment item, the location method comprising a detection of a predefined electrical signal as a function of electromagnetic signals received by an electromagnetic receiver of signals of the telecommunication equipment item able to receive communication signals following an injection of the electrical signal into a network of cables.

A subject of an exemplary embodiment of the invention is a method for signaling a network of cables which is able to be implemented by a communicating object comprising a generation of a predefined electrical signal able to be injected into a network of cables by using the wired transmission interface of the communicating object.

Advantageously, the predefined electrical signal is emitted on a predetermined part of a frequency band detectable by at least one receiver of electromagnetic signals of a telecommunication equipment item able to locate a network of cables.

Advantageously, according to one implementation of the invention, the various steps of the method according to an exemplary embodiment of the invention are implemented by an item of software or computer program, this item of software comprising software instructions intended to be executed by a data processor of a device forming part of a telecommunication equipment item or of a communicating object and being designed to control the execution of the various steps of this method.

An exemplary embodiment of the invention is therefore also aimed at a program comprising program code instructions for the execution of the steps of the location method and/or of the method of signaling when said program is executed by a processor.

This program can use any programming language and be in the form of source code, object code or code intermediate between source code and object code such as in a partially compiled form or in any other desirable form.

BRIEF DESCRIPTION OF THE DRAWINGS

The characteristics and advantages of exemplary embodiments of the invention will become more clearly apparent on reading the description, given by way of example, and the figures pertaining thereto which represent.

DETAILED DESCRIPTION OF ILLUSTRATIVE EMBODIMENTS

Figure 1A:
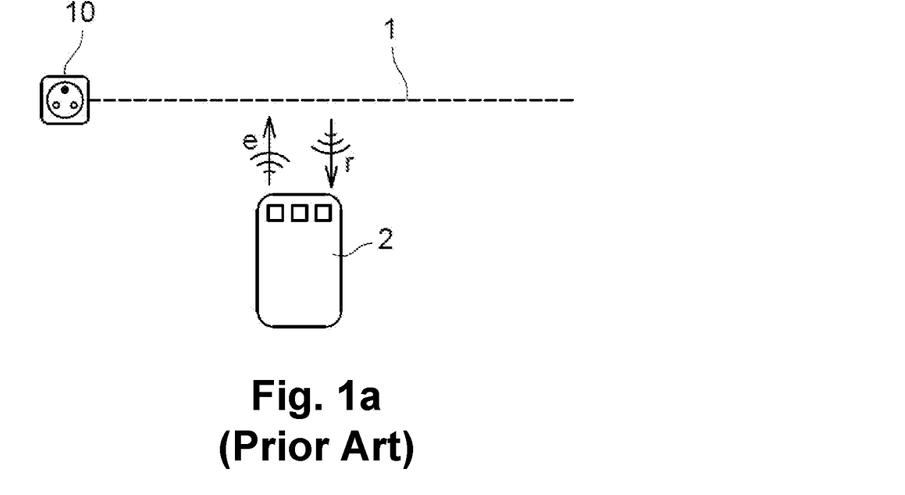
FIGS. 1a and 1b, simplified diagrams of dedicated cable detectors according to the prior art, respectively of material detectors and of cable tracers.
Figure 1B:
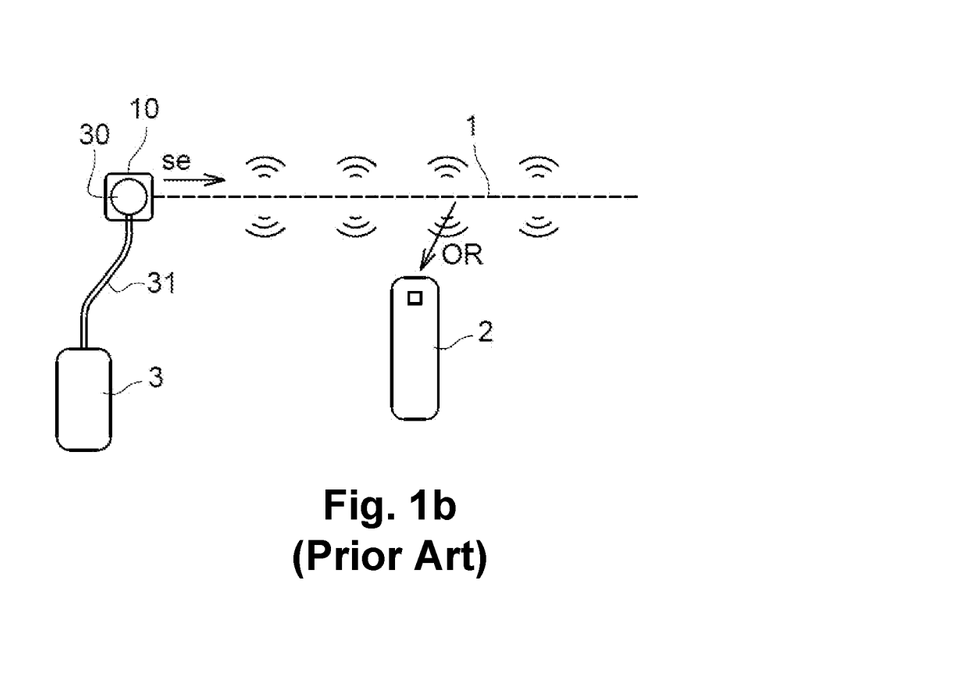

FIGS. 1a and 1b illustrate simplified diagrams of dedicated cable detectors according to the prior art.

In particular, FIG. 1a illustrates a simplified diagram of a material detector according to the prior art.

The material detector 2 emits electromagnetic or acoustic waves e. A cable 1 reflects the emitted wave e. The reflected wave r is captured by the materials detection tool which analysis it: in particular which calculates the duration of propagation of the wave and/or measures the power of the received signal. Thus the materials detection tool 2 provided location information in respect of the cables in particular in respect of distance on the basis of the calculation of duration of propagation and optionally additional information relating to the cables such as the types of cables, in particular of constituent materials (metals, plastics, etc.) of the cable 1 on the basis of the power received.

In particular, FIG. 1b illustrates a simplified diagram of a cable tracer according to the prior art.

The cable tracer comprises two items of equipment: an emitter 3 and a receiver 2.

The emitter 3 is connected by means of a cable 31 to a cable 1 of a network of cables. The cable 31 of the emitter 3 is terminated by a socket 30 allowing the injection of signals into a cable 1 when the socket 30 of the emitter 3 is plugged into an electrical socket 10 at the end of an electrical cable 1. In particular, the socket 30 of the emitter 3 is an electrical plug which facilitates its connection to the socket 10 of an electrical cable 1. The emitter 3 of the cable tracer injects an electrical signal se into the cable 1.

A radiation or occurs all along the cable 1. The receiver 2 of the cable tracer measures the electromagnetic field level sensed and displays this level, for example in the form of a number or of a luminous indicator. By moving the receiver 2 of the cable tracer along a wall, the user can track the positions where the electromagnetic field produced by the radiation of the cable 1 is highest and therefore determine the position of the cable inside the wall.

Figure 2:
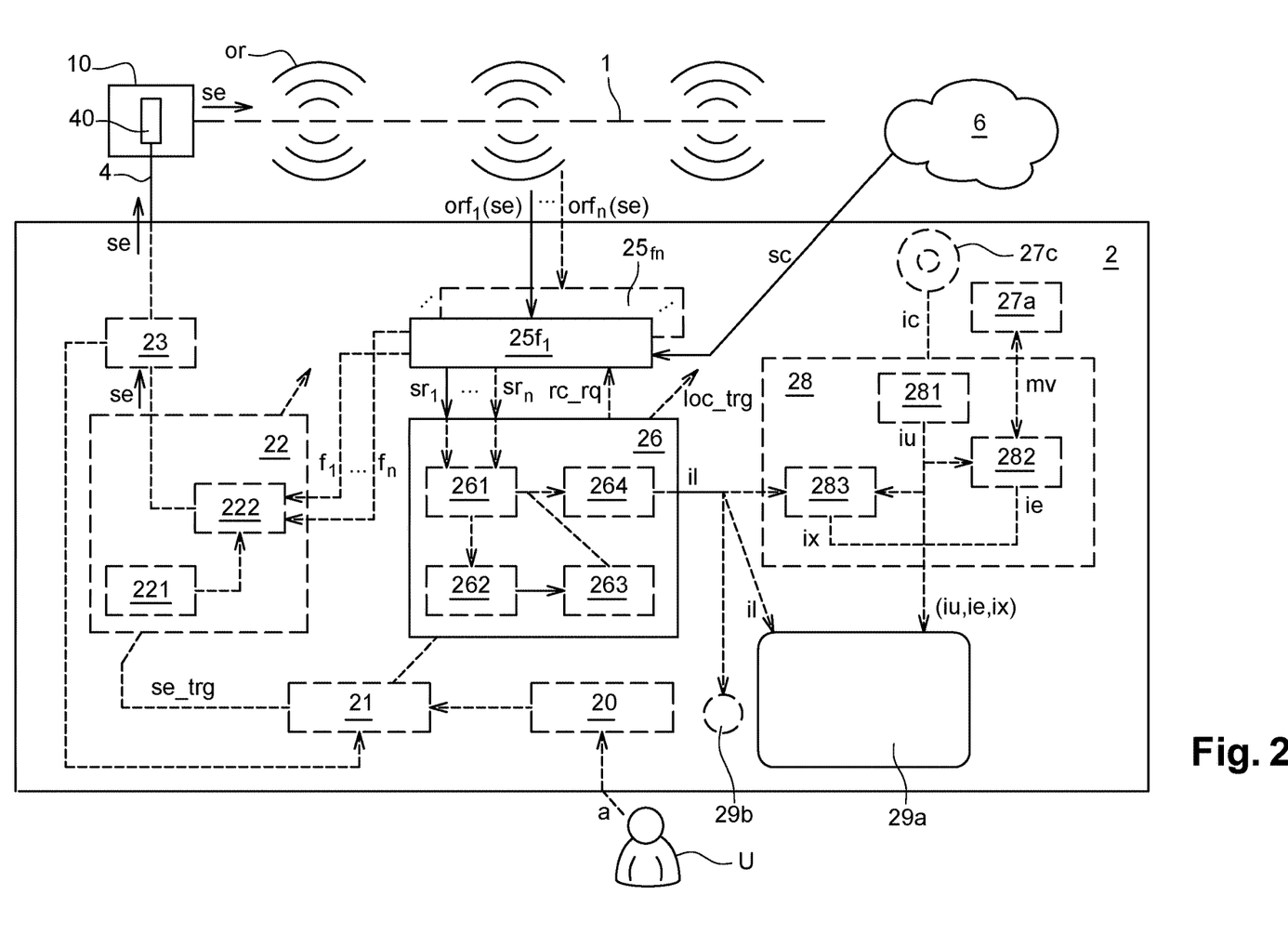
FIG. 2, a simplified diagram of a telecommunication equipment item according to an exemplary embodiment of the invention, FIG. 3, a simplified diagram of a communication architecture according to an exemplary embodiment of the invention, FIG. 4, a simplified diagram of the method for locating cables according to an exemplary embodiment of the invention, FIG. 5, a simplified diagram of the method of signaling according to an exemplary embodiment of the invention.

FIG. 2 is a simplified diagram of a telecommunication equipment item according to an exemplary embodiment of the invention.

The telecommunication equipment item 2 comprises a receiver of electromagnetic signals $25_{f1} \ldots 25_{fn}$ which is able to receive communication signals sc and a detector 26 of a predefined electrical signal se injected into a network of cables, also named network of conductors, as a function of electromagnetic signals or received by the receiver $25_{f1} \ldots 25_{fn}$.

In particular, the telecommunication equipment item 2 comprises:
- a wired transmission interface 23, in particular a data transfer port, able to be connected to a network of cables 1, and
- a generator 22 of the predefined electrical signal se able to be injected into the network of cables 1 by using the wired transmission interface 23.

The wired transmission interface 23 is, for example, an electrical charge interface.

In particular, the wired transmission interface 23 is linked by means of a cable 4 to the cable 1 to be detected. The cable 4 is connected to the cable 1, for example, by means of a jack 40 plugged into a socket 10 placed on the cable 1. In a particular embodiment, the wired transmission interface 23 is a unique port used for two functions: battery power supply and data transfer, such as a micro-USB port of type B.

In particular, the telecommunication equipment item 2 comprises a controller 21 of emission of predefined electrical signals which is able to trigger se_trg an emission via a wired transmission interface 23,33 of a communicating object 2, 3 of the predefined electrical signal se into a cable network 1 to which the communicating object 2,3 is connected by means of the wired transmission interface 23,33. The communicating object 2,3 is in particular the telecommunication equipment item 2 such as illustrated by FIG. 2 or a communicating object 3 distinct from the telecommunication equipment item 2.

In particular, the telecommunication equipment item 2 comprises a man machine interface 20 allowing the user U to trigger or to activate the detector 26 and/or the electrical signal generator 22. In particular, when the user U activates the detector 26, the controller 21 triggers se_trg the electrical signal generator 22. Conversely, when the user U activates the electrical signal generator 22, the controller 21 triggers loc_trg the detector 26.

In particular, the electrical signal generator 22 comprises a waveform generator 221 able to be easily detected. The waveforms are, for example, frequency-related and/or temporal waveforms. For example, the waveform is obtained by repeating a particular frequency pattern and/or temporal pattern.

Furthermore, the electrical signal generator 22 comprises, in particular, a frequency modulator 222 able to allow the electrical signal generated se to occupy a frequency band covering all or part of the frequency band detectable $f_1 \ldots f_n$ by the receivers $25_{f1} \ldots 25_{fn}$ of the telecommunication equipment item 2.

The detector 26 is in particular connected to a receiver $25_{f1} \ldots 25_{fn}$ able to detect electromagnetic fields. In particular, the predefined electrical signal detector 26 comprises a measurement device 261 for measuring the level of the received signal $sr_1 \ldots sr_n$ in a frequency band associated with the receiver $25_{f1} \ldots 25_{fn}$. In particular, the detector 26 is an analyzer able to locate as a function of the electromagnetic fields detected the cable 1 via which the signal se was emitted.

In particular, the detector 26 comprises a discriminator 263 of the predefined electrical signal se in the received signal $sr_1 \ldots sr_n$ provided by the receiver $25_{f1} \ldots 25_{fn}$. In particular, the detector 26 comprises a sampler 262 of the received signal $sr_1 \ldots sr_n$ provided by the receiver $25_{f1} \ldots 25_{fn}$ able to provide the sampled received signal Sr to the discriminator 263.

Figure 3:
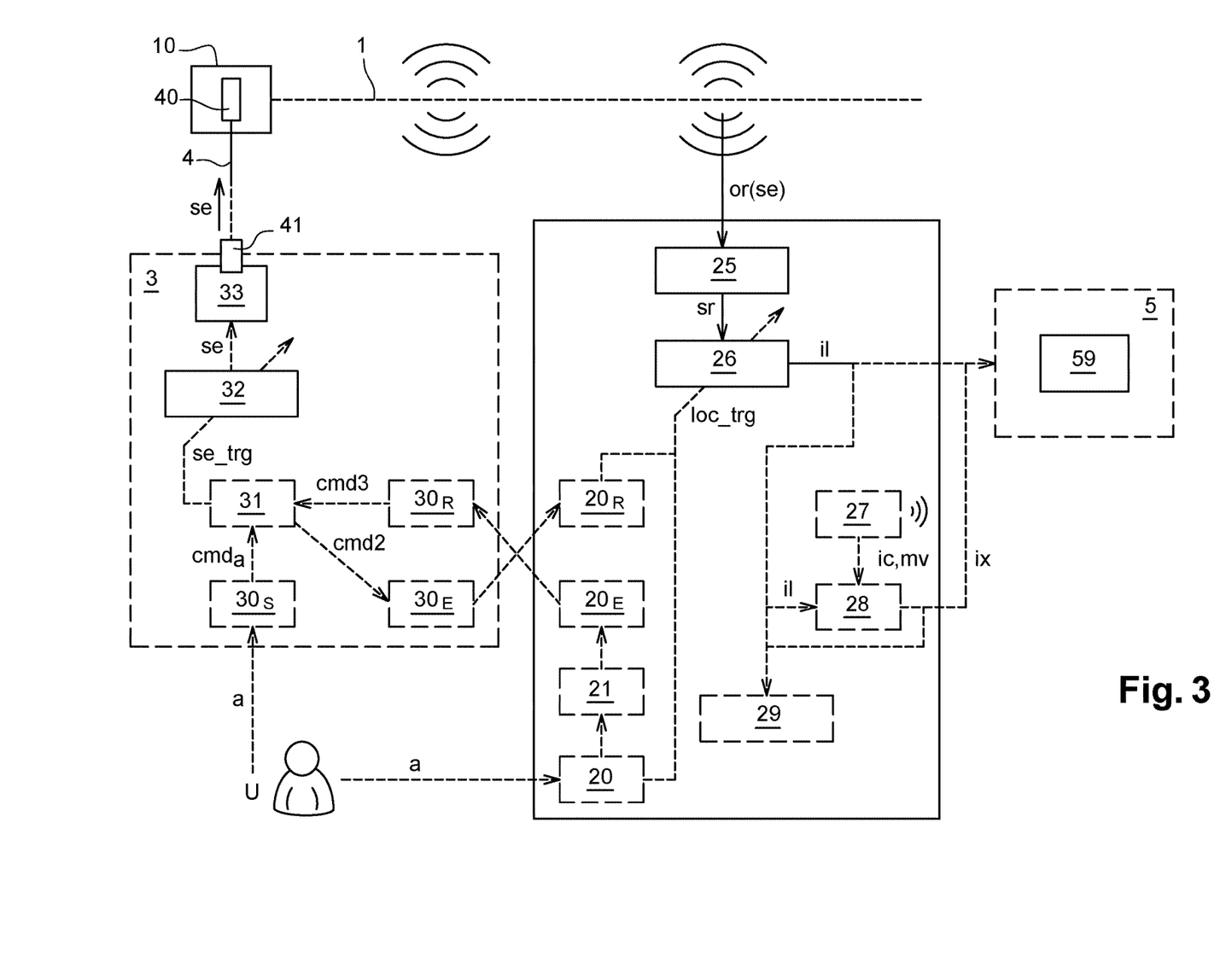

In particular, the telecommunication equipment item 2 comprises a generator of a location information item 264, 283 as a function of the predefined electrical signal detected by the detector 26, the location information item il being able to be reproduced by a reproduction device 29a, 29b. The reproduction device 29a, 29b is implemented in the telecommunication equipment item 2 such as illustrated by FIG. 2 or in a communicating reproduction equipment item 5 such as illustrated by FIG. 3. Optionally the location information item generator 264 is implemented in the detector 26 such as illustrated by FIG. 2.

In particular, the location information item il is able to control an indicator of the reproduction device 29a, 29b as a function of the electromagnetic field level of the predefined electrical signal se detected by the detector 26.

In particular, the telecommunication equipment item 2 comprises a camera 27c able to capture a unitary image iu during the implementation of the detector 26 of the predefined electrical signal, the unitary image iu being able to be provided to the location information item generator 283.

In particular, the telecommunication equipment item 2 comprises an extended-image generator 282 for generating an extended image as a function of unitary images iu captured by the camera 27c during the implementation of the detector 26 of the predefined electrical signal, the extended image ie being able to represent a stitching of the unitary images iu and to be provided to the location information item generator 283.

In particular, the extended-image generator 282 uses data originating from at least one accelerometer 27a of the telecommunication equipment item 2.

In particular, the telecommunication equipment item 2 comprises an image processing device 283 able to superimpose on an image iu, ie an information item il as a function of the electromagnetic field level of the predefined electrical signal se detected by the detector 26, the processed image ix being able to be provided to the reproduction device 29a.

In particular, the telecommunication equipment item 2 is a communication terminal, such as a smartphone, a tablet . . . .

The advantage is that users generally already have at their disposal such telecommunication equipment items 2 and the cable 4 which serves to connect the smartphone 2 up to the power supply. Smartphones are furnished with means for receiving electromagnetic signals implemented for the reception of wireless communication signals (in particular of mobile communication signals via a mobile telephone network 6 for example). These receivers are composed of a reception antenna 25 and of a circuit for receiving the signal, serving in an exemplary embodiment of the invention as detector 26. The reception circuits 26 comprise means for measuring the level of the received signal 261, of samplers 262 and of means for storing the received signal (not illustrated), for example buffer memory.

In general, one or more reception chains (antenna+circuit) are available for a telecommunication equipment item 2 such as a smartphone, as a function of the communication norms implemented. For example, today's smartphones comprise receivers 25:
- for GSM signals in the frequency bands around 900 MHz or 1800 MHz,
- for 3G signals in the frequency bands around 900 MHz and 2100 MHz,
- for 4G signals in the frequency bands around 800 MHz, 1800 Mz and 2600 MHz,
- for Bluetooth (registered trademark) signals in the frequency bands around 2400 MHz,
- for Wifi (registered trademark) signals in the frequency bands around 2400 MHz and 5000 MHz,
- etc.

An exemplary telecommunication equipment item according to the invention is a smartphone 2 which uses at least one reception chain 25, 26 to capture the predefined electrical signal injected into the cable 1. The electrical signal se is emitted in one of the frequency bands used by one of the receivers 25 of the smartphone 2. This is in particular carried out with the aid of a transmission port using the USB 3.0 standard capable of emitting signals with an appreciable power in a frequency band from 0 to 3000 MHz.

The smartphone 2 is furnished with a screen 29a making it possible to display information, in particular the electromagnetic field level measured by the detector 26 and/or location information items provided by the location information item generator 264, 283. A way of locating the cable 1 is to display on the screen 29a or an indicator, such as a light-emitting diode or Led, or a series of diodes, etc., an information item indicating the electromagnetic field level measured in the form of a color code, of a bar level or number, etc. By moving the smartphone 2 in proximity to a wall in which the cable 1 is embedded, the user U will be able to observe the places where the electromagnetic radiation or is most powerful and therefore to locate the whereabouts of the electrical cable 1.

In order to improve both the precision and the attractiveness of the man-machine interface, an exemplary embodiment of the invention also relates to an advanced method for viewing the location of the cable in particular implemented by the location method according to an exemplary embodiment of the invention, using the hardware means already present in the smartphone 2. By using the camera 27c of the smartphone 2, an image of the wall can be represented on the screen 29a of the smartphone 2. When the detector 26 starts the measurement device 261, a first radiated field level $lv_1$ is measured and associated with this unitary image $iu_1$ by the unitary image generator 281. The measurement is continued by moving the smartphone 2. Then, new unitary images of the wall $iu_i$ and the radiated field level $lv_i$ associated with each unitary image are obtained in a continuous and successive manner. The extended-image generator 282 is then able to progressively construct an extended image of the wall ie, in particular by superposition and stitching of the unitary images obtained $\{iu_i\}_i$. The extended-image generator 282 implements in particular an extended-image generation method similar to the method of on-the-fly panoramic photo generation implemented by digital cameras (and smartphones).

The location information item generator 283 is in particular able to associate with each pixel of the extended image ie a calculated level of radiated power which is dependent on the measured levels $lv_i$ associated with the unitary images $iu_i$ which include this pixel. For example, the calculated radiated power level associated with a pixel of the extended image is the average of the measured levels associated with the unitary images which include this pixel.

Thus, the location information item generator 283 can provide the screen 29a with:
- either the unitary image currently being observed and on which has been superposed a radiation level (in the form of a color code semi-transparent superposition for example), corresponding to the radiated power level calculated for the part of the extended image currently being viewed.
- or the extended image of the wall and on which has been superposed, for each pixel a radiation level (in the form of a color code semi-transparent superposition for example), corresponding to the radiated power level calculated for this pixel of the extended image.

By this technique, an augmented image of the wall ix supplemented with a radiation information item with a fine resolution is obtained. In practice, the user U sees, on the screen 29a, the wall and the location of the radiation level in a superposed manner. This type of viewing is used especially in the augmented reality sector.

Note that for the generation of the extended image ie, the smartphone 2 can be based solely on the images captured by the camera 29a and carry out the superposition and the stitching solely by image processing. This functionality can however be improved by associating information collected by another sensor 27a, such as its accelerometer for example, about the movement of the smartphone.

FIG. 3 illustrates a simplified diagram of a communication architecture according to an exemplary embodiment of the invention.

The communication architecture comprises a telecommunication equipment item in particular such as that described by FIG. 2, a connection cable 4 for connecting a communication device such as the telecommunication equipment item 2 or a communicating object 3 to a cable 1 of a network of cables. Furthermore, the communication architecture optionally comprises a communicating object 3 and/or a communicating reproduction device 5.

The communicating object 3 comprises a wired transmission interface 33 able to be connected to a network of cables 1, and a generator 32 of the predefined electrical signal se able to be injected into a network of cables 1 by using the wired transmission interface 33.

In particular, the wired transmission interface 33 is linked by means of a cable 4 to the cable 1 to be detected. The cable 4 is connected to the cable 1, for example, by means of a jack 40 plugged into a socket 10 placed on the cable 1. In a particular embodiment, the wired transmission interface 33 is a unique port used for two functions: battery power supply and data transfer, such as a micro-USB port of type B.

In particular, the communicating object 3 comprises a location controller 31 able to trigger loc_trg a cable location by using at least one receiver of electromagnetic signals 25 of a telecommunication equipment item 2 able to receive an electromagnetic signal produced by the radiation of a predefined electrical signal se in a cable network 1 to which the communicating object 2,3 is connected by means of the wired transmission interface 33. The communicating object 3 is in particular the telecommunication equipment item 2 such as illustrated by FIG. 2 or a communicating object 3 distinct from the telecommunication equipment item 2 as illustrated by FIG. 3.

In particular, the communication object 3 comprises an emitter $30_E$ and/or a receiver $30_R$ allowing the communicating object to exchange with the telecommunication equipment item 2. Thus, the emitter $30_E$ is able to emit the triggering command loc_trg generated by the controller 31 destined for the telecommunication equipment item 2.

In particular, the communicating object 3 comprises a man machine interface 30 allowing the user U to trigger or to activate the electrical signal generator 32. In particular, when the user U activates the electrical signal generator 32, the controller 31 triggers loc_trg the detector 26 of the telecommunication equipment item 2.

In an alternative manner, the electrical signal generator 32 is controlled se_trg by the telecommunication equipment item 2: in particular its triggering or its activation is performed following the reception by the receiver 30R of a command se_trg, emitted by the telecommunication equipment item 2, for triggering the electrical signal generator 32.

In particular, the electrical signal generator 32 comprises a waveform generator 321 able to be easily detected (not illustrated). The waveforms are, for example, frequency waveforms and/or temporal waveforms. For example, the waveform is obtained by repeating a particular frequency pattern and/or temporal pattern.

Furthermore, the electrical signal generator 32 comprises, in particular, a frequency modulator 322 (not illustrated) able to allow the electrical signal generated se to occupy a frequency band covering all or part of the frequency band detectable $f_1 \ldots f_n$ by the receivers $25_{f1} \ldots 25_{fn}$ of the telecommunication equipment item 2.

The telecommunication equipment item 2 comprises a receiver 25 able to receive electromagnetic signals including those or(se) originating from the radiation by the cable 1 of the electrical signal se generated and then injected by the communicating object into the cable 1 via the cable for connection 4 to the cable network, and a detector 26 able to locate the cable 1 on the basis of the electromagnetic signals received sr.

In particular, the telecommunication equipment item 2 comprises a controller 21 of emission of predefined electrical signals which is able to trigger se_trg an emission via a wired transmission interface 33 of a communicating object 3 of the predefined electrical signal se into a cable network 1 to which the communicating object 3 is connected by means of the wired transmission interface 33.

In particular, the telecommunication equipment item 2 comprises an emitter $20_E$ and/or a receiver $20_R$ allowing the telecommunication equipment item 2 to exchange with the communicating object 3. Thus, the emitter $20_E$ is able to emit the triggering command se_trg generated by the controller 21 destined for the communicating object 3.

In particular, the telecommunication equipment item 2 comprises a man machine interface 20 allowing the user U to trigger or to activate the detector 26. In particular, when the user U activates the detector 26, the controller 21 triggers se_trg the electrical signal generator 22.

In an alternative manner, the detector 26 is controlled loc_trg by the communicating object 3: in particular its triggering or its activation is performed following the reception by the receiver 20R of a command loc_trg, emitted by the communicating object 3, for triggering the detector 26.

Optionally, the telecommunication equipment item 2 comprises at least one from among the following devices described more precisely on reading FIG. 2:
  a sensor 27, such as a camera, an accelerometer, etc.;
  a location-enhanced-image generator 28;
  a location information item reproducer 29, such as an indicator, a screen, etc.

In an alternative manner, the location information item reproducer 29 is not implemented by the location equipment item but in a reproduction device 5 distinct from the telecommunication equipment item 2.

Several cases of use may be envisaged:

A tablet or a smartphone corresponding to the telecommunication equipment item 2 of FIG. 2 is connected by means of a recharging cable in particular USB to the cable to be detected via a socket of the cable network (electrical cable but also telephone cable, etc.). It is either moved along the wall or walls in which the cable is embedded or placed at a detection position relating to this or these walls so as to measure the electromagnetic signals over the whole of the wall or walls.

In order to avoid the use of long connection cable, other cases of use are envisaged.

A connected object such as a watch, a connected button, etc. constituting the communication object 3 and a tablet or smartphone constituting the telecommunication equipment item 2 such as illustrated by FIG. 3. The object connected to a telecommunication network (local and/or remote) is connected by means of a recharging cable in particular USB to the cable to be detected via a socket of the cable network (electrical cable but also telephone cable, etc.). The smartphone is either moved along the wall or walls in which the cable are embedded or placed at a detection position relating to this or these walls so as to measure the electromagnetic signals over the whole of the wall or walls.

Conversely, the tablet or the smartphone is connected by means of a recharging cable in particular USB to the cable to be detected via a socket of the cable network (electrical cable but also telephone cable, etc.). And, it is the connected object which is either moved along the wall or walls in which the cable are embedded or placed at a detection position relating to this or these walls so as to measure the electromagnetic signals over the whole of the wall or walls. In this option, it can be envisaged that the reproduction device is distinct from the connected object and from the smartphone, for example a connected television or that the reproduction device used is not that of the connected object detecting the radiation but of the tablet or of the smartphone injecting the electrical signal.

The advantage of using telecommunication equipment items and/or communicating object to implement cable detection is that the location information items generated can be stored in these equipment items or in an equipment item of the communication network and/or be used by other devices such as the creation devices used by architects and/or contracting client on site or remotely since these telecommunication equipment items can transmit the location information items generated in signal and/or data file form. In particular, the telecommunication equipment item of an exemplary embodiment of the invention can also comprise a 3D modeler able to generate 3D plans of a building incorporating the location of the detected cables.

Figure 4:
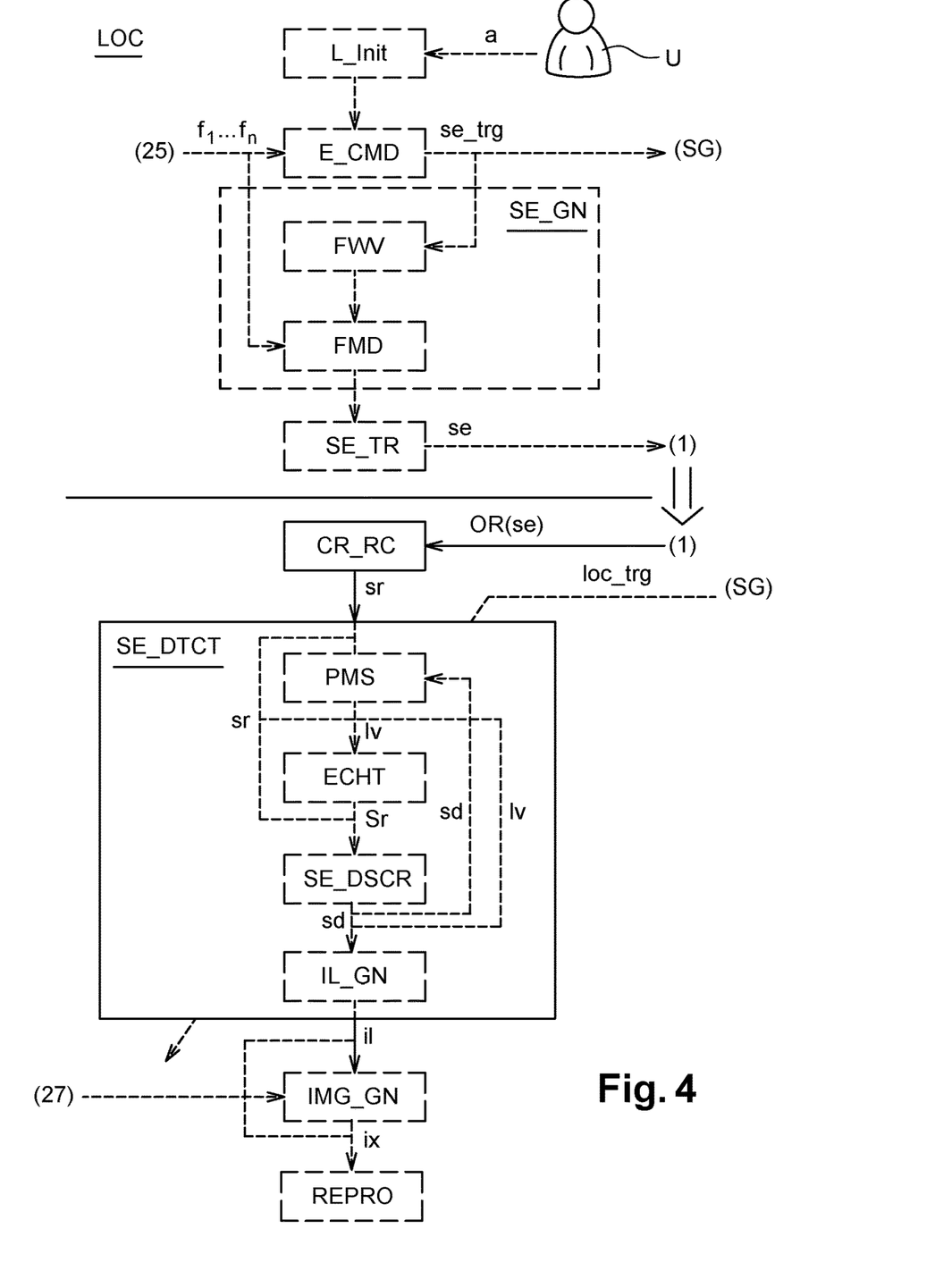

FIG. 4 illustrates a simplified diagram of the method for locating cables according to an exemplary embodiment of the invention.

The cable network location method LOC able to be implemented by a telecommunication equipment item 2 comprises, following an injection of an electrical signal se into a network of cables 1, a detection of the predefined electrical signal SE_DTCT as a function of electromagnetic signals received or(se) by an electromagnetic receiver of signals 25 of the telecommunication equipment item 2 able to receive communication signals sc.

In particular, the location method LOC comprises, following an injection of an electrical signal se into a network of cables 1, a reception OR_RC of electromagnetic signals or(se) by an electromagnetic receiver of signals 25 of the telecommunication equipment item 2.

In particular, the location method LOC comprises an enhanced image generation IMG_GN using the location data obtained during detection SE_DTCT.

In particular, the location data LOC are levels of electromagnetic fields lv. In particular, the location method LOC comprises a measurement of the power PMS of the electromagnetic field produced by the radiation or(se) by the cable 1 of the electrical signal se injected. A simple way of measuring the electromagnetic field level consists in capturing all of the received signal in the frequency band received by the receiver of the telecommunication equipment item 2 and to carry out a level measurement with the aid of the devices available in the reception chain of the telecommunication equipment item 2.

In particular, the location data LOC are a discriminated signal sd. In particular, the location method comprises a discrimination of the predefined electrical signal SE_DSCR in the received signal sr during reception OR_RC. Optionally, the discrimination SE_DSCR is dependent on the measured power lv. The discrimination SE_DCSR implements in particular a correlation scheme for correlating between the received signal sr and the predefined signal injected se. Discrimination allows more precise measurement of the signal level received corresponding to the predefined signal only.

In particular, the location method LOC comprises a sampling ECHT of the received signal sr. The discrimination SE_DSCR is then performed not directly on the received signal sr but the sampled signal Sr.

In particular, the power measurement PMS is performed on the basis of the discriminated signal sd.

In particular, the location data LOC are a location information item il. In particular, the location method LOC comprises a location information item generator IL_GN for generating a location information item as a function of the measured power lv and/or of the discriminated signal sd, etc.

In particular, the detection SE_DTCT comprises at least one of the following steps:
  measurement of power PMS,
  sampling ECHT,
  discrimination SE_DSCR,
  generation of location information item IL_GN.

An embodiment of the location method LOC is a program comprising program code instructions for the execution of the steps of the location method when said program is executed by a processor, in particular of the telecommunication equipment item.

When the telecommunication equipment item 2 is also used to inject the predefined electrical signal se into the cable 1, the location method LOC implemented by the telecommunication equipment item 2 furthermore comprises the emission of the electrical signal SE_TR on the cable 1.

In this case of use, the location method LOC comprises, in particular, a generation of a predefined electrical signal SE_GN, provided on emission SE_TR.

In particular, the generation of the electrical signal SE_GN comprises a specific waveform generation FWV used to generate the electrical signal se. The waveform of the electrical signal: frequency waveform and/or temporal waveform is in particular defined in such a way that the detection rate is increased. For example, the waveform is generated by repeating a particular frequency pattern and/or temporal pattern.

In particular, the generation of the electrical signal SE_GN comprises a frequency modulation FMD such that the frequency band occupied by the electrical signal se covers all or part of the frequency band f1 ... fn of the receiver or receivers 25 of the telecommunication equipment item 2.

In particular, the user requests a the activation of the location method LOC during an initialization step L_Init. This step triggers the detection SE_DTCT and/or the generation of the electrical signal SE_GN.

When the location method LOC does not comprise the generation of the electrical signal SE_GN, the location method comprises, in particular, a control of the emission of the electrical signal E_CMD transmitting a triggering command se_trg to a method of signaling SG.

In an alternative manner, the detection SE_DTCT is triggered loc_trg by method of signaling SG implementing the injection of the electrical signal se into the cable 1.

Figure 5:
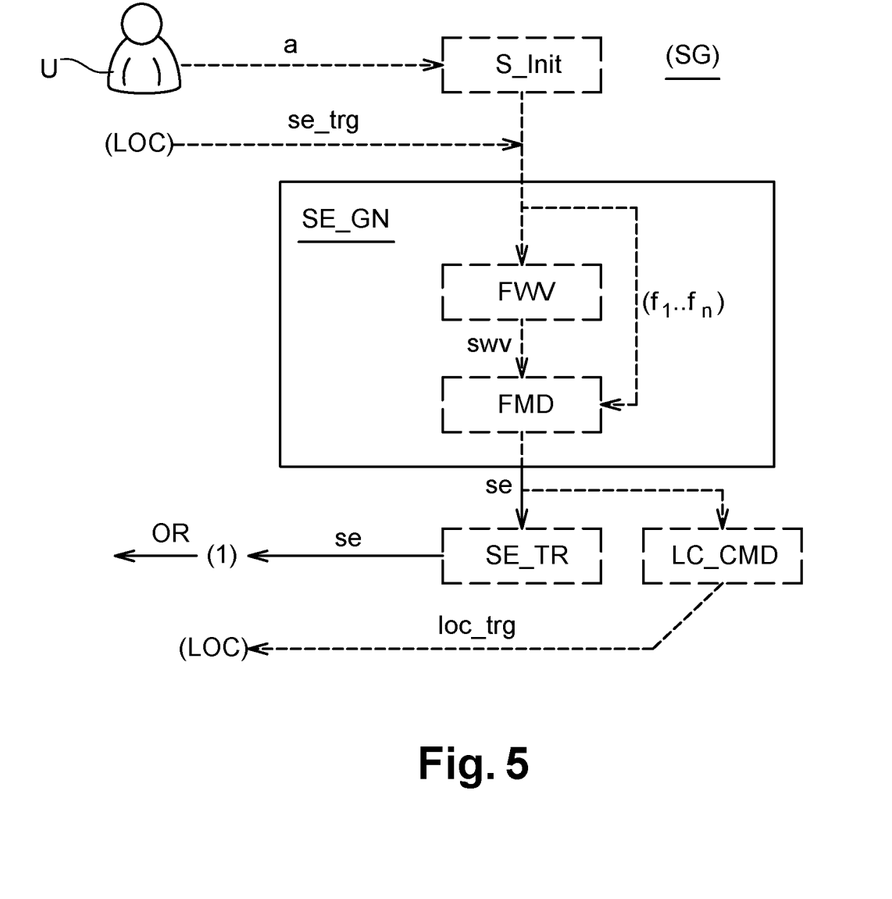

FIG. 5 illustrates a simplified diagram of the method of signaling according to an exemplary embodiment of the invention.

The method of signaling SG of a network of cables which is able to be implemented by a communicating object 3 comprises a generation of a predefined electrical signal SE_GN able to be injected into a network of cables 1 by using the wired transmission interface of the communicating object 3.

In particular, the predefined electrical signal se exhibits a waveform able to be detected.

In particular, the predefined electrical signal se is emitted on a predetermined part of a frequency band detectable by at least one receiver of electromagnetic signals 25 of a telecommunication equipment item 2 able to locate a network of cables 1.

In this case of use, the method of signaling SG comprises, in particular, a transmission or injection SE_TR of the predefined electrical signal generated se into a cable 1 of a network of cables.

In particular, the generation of the electrical signal SE_GN comprises a generation of specific waveform FWV used to generate the electrical signal se. The waveform of the electrical signal: frequency waveform and/or temporal waveform is in particular defined in such a way that the detection rate is increased. For example, the waveform is generated by repeating a particular frequency pattern and/or temporal pattern.

In particular, the generation of the electrical signal SE_GN comprises a frequency modulation FMD such that the frequency band occupied by the electrical signal se covers all or part of the frequency band f1 ... fn of the receiver or receivers 25 of the telecommunication equipment item 2.

In particular, the user requests a the activation of the method of signaling SG during an initialization step S_Init. This step triggers the generation SE_GN.

In particular, the method of signaling SG comprises, in particular, a control of the location LC_CMD transmitting a triggering command loc_trg to a location method LOC.

In an alternative manner, the electrical signal generation SE_GN is triggered se_trg by a location method LOC receiving the radiation or of the electrical signal se injected into the cable 1.

An embodiment of the method of signaling is a program comprising program code instructions for the execution of the steps of the method of signaling when said program is executed by a processor.

Thus, an exemplary embodiment of the invention can be deployed on communications devices in the form of software applications.

An exemplary embodiment of the invention is also aimed at a medium. The information medium can be any entity or device capable of storing the program. For example, the medium can comprise a storage means, such as a ROM, for example a CD ROM or a microelectronic circuit ROM or else a magnetic recording means, for example a diskette or a hard disk.

Moreover, the information medium can be a transmissible medium such as an electrical or optical signal which can be conveyed via an electrical or optical cable, by radio or by other means. The program according to an exemplary embodiment of the invention can be in particular downloaded over a network in particular of Internet type.

Alternatively, the information medium can be an integrated circuit in which the program is incorporated, the circuit being adapted to execute or to be used in the execution of the method in question.

In another implementation, an exemplary embodiment of the invention is implemented by means of software components and/or hardware components. In this regard the term module can correspond equally well to a software component or to a hardware component. A software component corresponds to one or more computer programs, one or more subprograms of a program, or more generally to any element of a program or of an item of software able to implement a function or a function set according to the description hereinabove. A hardware component corresponds to any element of a hardware set (or hardware) able to implement a function or a set of functions.

Although the present disclosure has been described with reference to one or more examples, workers skilled in the art will recognize that changes may be made in form and detail without departing from the scope of the disclosure and/or the appended claims.

The invention claimed is:

1. A telecommunication equipment item configured to communicate with other telecommunication equipment via a telecommunication network, the telecommunication equipment item comprising:
    a receiver configured to receive electromagnetic signals including wireless communication signals; and
    a cable detector configured to detect a predefined electrical signal injected into a network of cables as a function of radiated electromagnetic signals received by the receiver of the telecommunication equipment, the predefined electrical signal injected into the network of cables being radiated by the cables as radiated electromagnetic signals.

2. The telecommunication equipment item as claimed in claim 1, wherein the telecommunication equipment item comprises:
    a wired transmission interface able to be connected to the network of cables, and
    a generator of the predefined electrical signal able to be injected into the network of cables by using the wired transmission interface.

3. The telecommunication equipment item as claimed in claim 1, wherein the telecommunication equipment item comprises a controller of emission of the predefined electrical signal which is able to trigger an emission via a wired transmission interface of a communicating object of the predefined electrical signal in the network of cables to which the communicating object is connected by means of the wired transmission interface.

4. The telecommunication equipment item as claimed in claim 1, wherein the predefined electrical signal detector comprises a device configured to measure a level of the received signal in a frequency band associated with the receiver.

5. The telecommunication equipment item as claimed in claim 1, wherein the telecommunication equipment item comprises a generator of a location information item as a function of the predefined electrical signal detected by the detector, the location information item being able to be reproduced by a reproduction device.

6. The telecommunication equipment item as claimed in claim 5, wherein the location information item is configured to control an indicator of the reproduction device as a function of an electromagnetic field level of the predefined electrical signal detected by the detector.

7. The telecommunication equipment item as claimed in claim 5, wherein the telecommunication equipment item comprises a camera configured to capture a unitary image during implementation of the detector of the predefined electrical signal, the unitary image being provided to the location information item generator.

8. The telecommunication equipment item as claimed in claim 7, wherein the telecommunication equipment item comprises an extended-image generator configured to generate an extended image as a function of unitary images captured by the camera during the implementation of the detector of the predefined electrical signal, the extended image representing a stitching of the unitary images and being provided to the location information item generator.

9. The telecommunication equipment item as claimed in claim 8, wherein the extended-image generator uses data originating from at least one accelerometer of the telecommunication equipment item.

10. The telecommunication equipment item as claimed in claim 7, wherein the telecommunication equipment item comprises an image processing device configured to superimpose on an image an information item as a function of an electromagnetic field level of the predefined electrical signal detected by the detector, the processed image being provided to the reproduction device.

11. A communicating object comprising:
    a wired transmission interface configured to be connected to a network of cables of a communication network;
    a generator of a predefined electrical signal configured to be injected into the network of cables using the wired transmission interface; and a communication interface configured to communicate information relating to the predefined electrical signal with a cable detector configured to detect the predefined electrical signal over a communication network.

12. A method of cable network location comprising the following acts implemented by a telecommunication equipment item that is configured to communicate with other telecommunication equipment via a telecommunication network:
receiving, by an electromagnetic receiver of the telecommunication equipment item configured to receive wireless communication signals, electromagnetic signals radiated from a network of cables responsive to an injection of a predefined electrical signal into the network of cables; and
detecting the predefined electrical signal as a function of the received electromagnetic signals.

13. A method for signaling a network of cables implemented by a communicating object, the method comprising:
generating a predefined electrical signal using a generator of the communicating object;
injecting the predefined electrical signal into a network of cables using a wired transmission interface of the communicating object; and
communicating information relating to the predefined electrical signal with a cable detector configured to detect the electrical signal over a communication network using a communication interface of the communicating object.

14. The method as claimed in claim 12, wherein the predefined electrical signal is emitted on a predetermined part of a frequency band detectable by the electromagnetic receiver of the telecommunication equipment item.

15. A non-transitory computer-readable medium comprising instructions stored thereon, which when executed by a processor of a telecommunication equipment item, which is configured to communicate with other telecommunication equipment via a telecommunication network, configure the telecommunication equipment item to perform acts comprising:
receiving, by an electromagnetic receiver of the telecommunication equipment item configured to receive wireless communication signals, electromagnetic signals radiated from at network of cables responsive to an injection of a predefined electrical signal into the network of cables; and
detecting the predefined electrical signal as a function of the received electromagnetic signals.

16. The method as claimed in claim 13, wherein the act of injecting comprises emitting the predefined electrical signal on a predetermined part of a frequency band detectable by an electromagnetic receiver of a telecommunication equipment item.

17. The telecommunication equipment item of claim 1, wherein the wireless communication signals include mobile communication signals from a mobile telephone network, Wi-Fi signals, or Bluetooth signals.

18. The telecommunication equipment item of claim 17, wherein the telecommunication equipment item is a smartphone, or a tablet.

19. The method of claim 12, wherein the wireless communication signals include mobile communication signals from a mobile telephone network, Wi-Fi signals, or Bluetooth signals.

20. The method of claim 19, wherein the telecommunication equipment item is a smartphone, or a tablet.

21. The non-transitory computer-readable medium of claim 15, wherein the wireless communication signals include mobile communication signals from a mobile telephone network, Wi-Fi signals, or Bluetooth signals.

22. The non-transitory computer-readable medium of claim 21, wherein the telecommunication equipment item is a smartphone, or a tablet.

* * * * *